United States Patent [19]
Jacobs et al.

[11] Patent Number: 5,481,219
[45] Date of Patent: Jan. 2, 1996

[54] APPARATUS AND METHOD FOR GENERTING NEGATIVE BIAS FOR ISOLATED MOSFET GATE-DRIVE CIRCUITS

[75] Inventors: Mark E. Jacobs, Dallas; Vijayan J. Thottuvelil, Richardson; Kenneth J. Timm, Rockwall, all of Tex.

[73] Assignee: AT&T Corp., Murray Hill, N.J.

[21] Appl. No.: 278,474

[22] Filed: Jul. 20, 1994

[51] Int. Cl.⁶ .......................... H03K 17/04; H03K 17/16
[52] U.S. Cl. ................ 327/434; 327/377; 327/389; 327/421; 327/541
[58] Field of Search ................ 327/541, 377, 327/389, 421, 434

[56] References Cited

U.S. PATENT DOCUMENTS 4,728,826   3/1988   Einzinger et al. ............... 327/377
4,748,351   8/1988   Barzegar ........................... 307/571

Primary Examiner—Margaret Rose Wambach
Attorney, Agent, or Firm—Alfred G. Steinmetz

[57] ABSTRACT

An isolated MOSFET gate drive includes circuitry to provide a negative gate bias during the off time of the MOSFET to enhance its immunity to inadvertent turn-on. The bias is generated by a self contained two terminal passive network which may be "floated" at any potential with respect to ground. This bias is automatically generated through the action of the network to the gate drive waveform, eliminating the need for an external bias supply to provide this voltage. The bias supply is located locally, thus eliminating the need for long interconnects which may interfere with circuit operation. The bias network in one implementation is a combination of a capacitor and non-linear semiconductor device with a fixed voltage breakdown characteristic. This two-component implementation maintains the capability of producing systems with high packaging densities.

2 Claims, 2 Drawing Sheets

5,481,219

1

APPARATUS AND METHOD FOR GENERTING NEGATIVE BIAS FOR ISOLATED MOSFET GATE-DRIVE CIRCUITS

FIELD OF THE INVENTION

This invention relates to MOSFET gate drive circuits and in particular to isolated MOSFET gate drive circuits in which a negative gate bias is provided during the off time of the MOSFET to enhance its immunity to inadvertent turn-on.

BACKGROUND OF THE INVENTION

A number of MOSFET gate-drive schemes utilize an active switch between gate and source to provide fast turn-off of the MOSFET. In these circuit arrangements, the gate is ordinarily clamped at zero volts with respect to the source, sometimes providing only 1.5 volts of margin against noise-induced MOSFET turn-on, depending on the actual threshold voltage of the device.

Noise susceptibility in high power MOSFET gate drive circuits becomes increasingly troublesome as switching speed and power level increase. High current switching paths and parasitic couplings superimpose spurious spikes into the gate drive circuits. Under certain conditions of polarity and amplitude, noise voltage pulses in the gate-drive circuit may be such that their effects combine to turn the MOSFET switches on at inappropriate times. Catastrophic circuit failure may then result.

SUMMARY OF THE INVENTION

A MOSFET gate drive includes circuitry to provide a negative gate bias during the off time of the MOSFET to enhance its immunity to inadvertent turn-on. The bias is generated by a self contained two terminal passive network which may be "floated" at any potential with respect to ground. This bias is automatically generated through the action of the network to the gate drive waveform, eliminating the need for an external bias supply to provide this voltage. Each bias supply is located locally, thus eliminating the need for long interconnects which may interfere with circuit operation. The bias network in one implementation is a combination of a capacitor and non-linear semiconductor device with a fixed voltage breakdown characteristic. This two-component implementation maintains the capability of producing systems with high packaging densities.

2

DETAILED DESCRIPTION

Figure 1:
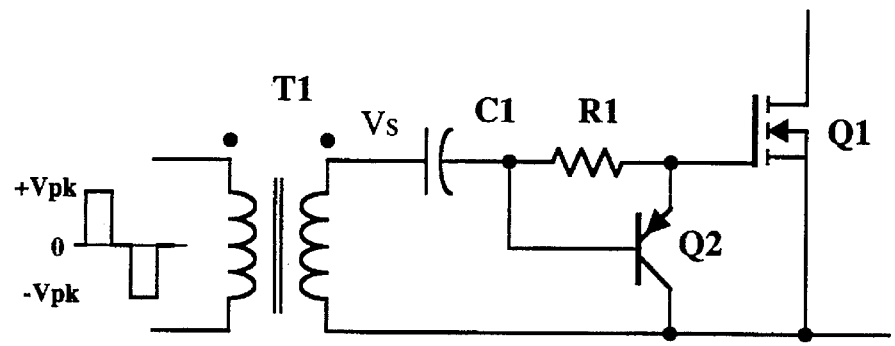
FIG. 1 is a schematic of a prior art isolated gate-drive circuit using a bipolar transistor.

An example of a prior art gate-drive circuit for driving a power MOSFET is shown in FIG. 1 and utilizes an active switch Q2 to clamp the gate of the power MOSFET to the return lead of the source voltage provided by the secondary winding of drive transformer T1. This arrangement is susceptible to the ringing occurring during clamping which may cause spurious turn-on of the power MOSFET. No negative bias source is included to counteract ringing.

Figure 2:
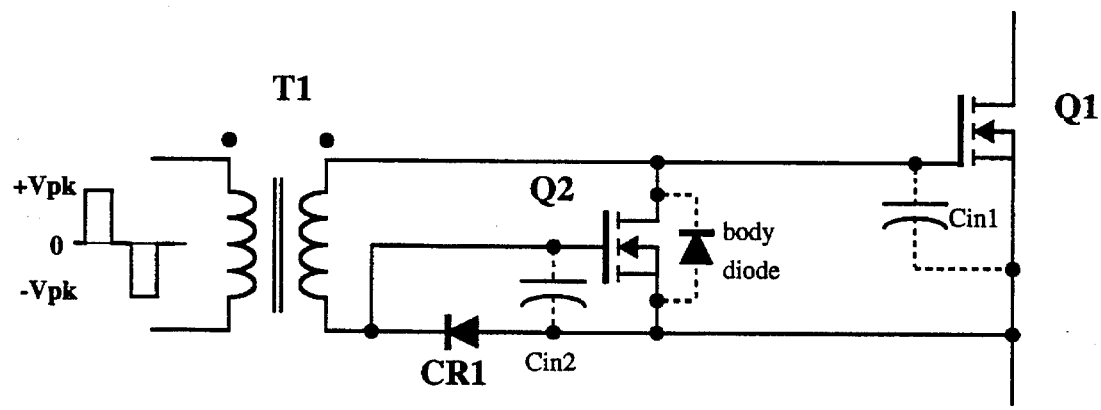
FIG. 2 is a schematic of a gate drive circuit using a MOSFET for driving a power MOSFET switch.

Another gate-drive circuit clamping the gate to zero volts without negative bias was disclosed in the copending application disclosing a "High Performance Isolated Gate-Drive Structure for MOSFET Power Switches" by K. J. Timm, and having Ser. No. 081,278,474, filed on, Jul. 20, 1994, is shown in FIG. 2. In FIG. 2, the drive signal applied to the isolation transformer T1 is a rectangular, bipolar waveform, and has an amplitude of typically 12 to 15 V. This signal is derived from a low impedance source, e.g. totem-pole connected MOSFETs. To maintain low impedance it is desirable to have tight coupling between the primary and secondary circuits. This can be accomplished with a unity turns ratio transformer and bifflax windings, if permissible. The drive waveform can be divided into three distinct regions: A first region has a positive polarity with an amplitude of +Vpk corresponding to Q1 being "on". A second region has a negative polarity with amplitude of −Vpk corresponding to Q1 being "off" and the gall-source impedance held low. A third region has a zero amplitude or "dead- time" occurring between the first and second regions and during which dead time Q1 must be "off". Dead-time is added to ensure that destructive simultaneous (overlap) conduction between the upper (high-side) MOSFET(s) and low-side MOSFET(s), in a half or full-bridge converter topology will not occur.

The drive MOSFET Q2 exhibits high transconductance (gm) for all operational conditions, draws no steady stall gate current and imposes a minimum load on the gate driver circuits. It is therefore able to support large drain currents without incurring the base current load penalty imposed by bipolar transistor devices.

With positive voltage at the dotted ends of the transformer T1, a pulse of current flows in the gate circuit loop. This loop consists of the secondary of T1, the gate input capacitance of Q1 (Cin1) and diode CR1. Cinl is charged to +Vpk turning power MOSFET Q1 "on" when Vgs(th) is reached. At this point drive MOSFET Q2 is effectively out of the circuit.

During the dead-time interval, which may be as little as 100nS, power MOSFET Q1 is required to be "off". Capacitor Cin1 enters this time period with an initial voltage of +Vpk. When the transformer secondary voltage drops to zero at the beginning of the dead-time interval, the voltage on capacitor Cin1 causes charge to be transferred to capacitor Cin2. By design Cin1>>Cin2, so, while charge is shared between the two capacitors, there is little voltage droop and drive MOSFET Q2 turns "on" strongly. Since drive MOSFET Q2's discharge path bypasses the leakage reactance of T1, the gate voltage of power MOSFET Q1 falls very rapidly. The negative bias supply ensures that, during the dead-band period, MOSFET Q1 is turned off well before Q2 discharges its source of positive voltage, (Vbias plus the voltage on Cin1).

Figure 3:
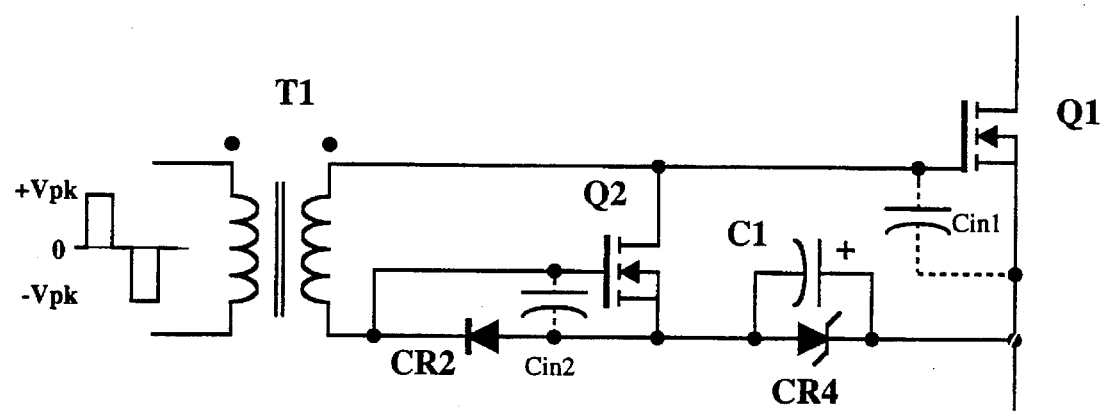
FIG. 3 is a schematic of a gall driver circuit for driving a power MOSFET switch and including a negative bias source in the drive circuit.

An improved gate drive circuit incorporating the principle of this invention is shown in FIG. 3. The improvement consists of the parallel combination of a nonlinear breakdown diode (i.e. zener diode) CR4 and a capacitor C1. With the addition of the parallel combination, assuming an N-channel power MOSFET for Q1, a negative dc voltage is applied between gate and source of the switch providing an additional degree of protection against inadvertent turn-on of the power MOSFET. In this case the noise spike would have to overcome the magnitude of the negative bias as well as attain the gate-source threshold voltage before the MOSFET can be commutated on. The introduced negative bias provides a substantial degree of protection not present by merely attempting to hold the gate at zero volts.

Figure 4:
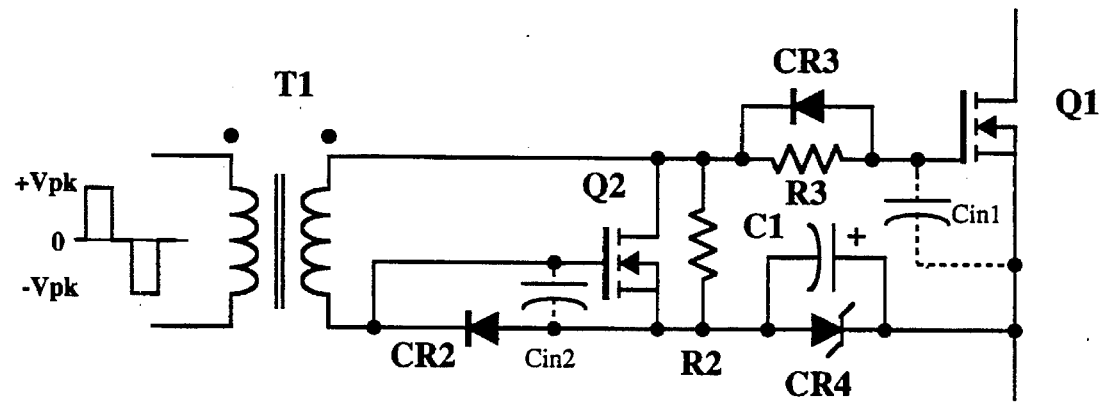
FIG. 4 is a schematic of a practical gall driver circuit driving a power MOSFET switch and including a negative bias source in the drive circuit.

An enhanced version of the drive circuit for practical applications is shown in FIG. 4. The circuit is enhanced by the inclusion of R2, CR3 and R3. In this drive circuit a pulse of current flows in the loop consisting of C1, CR2, T1 secondary, R3 and the gate input capacitance of Q1 (Cin1). This current sets up a voltage across C1 equal to the voltage of a zener diode CR4. The charge on C1 is refreshed at the gate switching rate and, if C1 is large enough, there will be only a small amount of voltage droop caused by charge redistribution between C1 and other circuit capacitances. When the polarity at the transformer dots is negative, Q2 will turn on, providing a low impedance between the gate and the bias supply. The gate-source voltage of Q1 will thus be negative and equal to the bias present on C1 (set by the zener diode CR4).

While a specific example has been shown, the zener diode and capacitor negative bias generator can be added to other gate-drive circuits such as the scheme shown in FIG. 1. Various combinations will suggest themselves to those skilled in the art without departing from the spirit and scope of the invention.

We claim:

1. A gate driver for a power MOSFET switch having gate, source and drain electrodes, comprising:

a drive transformer including a secondary winding connected for supplying a drive voltage to drive circuitry connected to drive the power MOSFET switch;

the drive circuitry including, a drive MOSFET device having gate, source and drain electrodes, connected to be responsive to the seconding winding and having its drain-source connected to control a gate-source voltage of the power MOSFET switch;

a bias circuit connecting the drain-source of the drive MOSFET device to the gate-source of the power MOSFET and providing a voltage differential therebetween, of a polarity to prevent spurious turn-on of the power MOSFET switch, the bias circuit comprising; a zener diode operating as a non-linear semiconductor breakdown device having a defined breakdown voltage, and the bias circuit further including a capacitor.

2. A gate driver for a power MOSFET switch having gate, source and drain electrodes, comprising:

a drive transformer including a secondary winding connected for supplying a drive voltage to drive circuitry connected to drive the power MOSFET switch;

the drive circuitry including, a drive MOSFET device having gate, source and drain electrodes, connected to be responsive to the seconding winding and having its drain-source connected to control a gate-source voltage of the power MOSFET switch;

a bias circuit connecting the drain-source of the drive MOSFET device to the gate-source of the power MOSFET and providing a voltage differential therebetween, of a polarity to prevent spurious turn-on of the power MOSFET switch, the bias circuit comprising; a zener diode operating as a non-linear semiconductor breakdown device having a defined breakdown voltage, and the bias circuit further including a capacitor connected in parallel with the zener diode.

* * * * *